(12) United States Patent
Gleich et al.

(10) Patent No.: US 7,626,390 B2
(45) Date of Patent: Dec. 1, 2009

(54) ELECTROACOUSTIC CABLE FOR MAGNETIC RESONANCE APPLICATIONS

(75) Inventors: Bernhard Gleich, Hamburg (DE); Volkmar Schulz, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 195 days.

(21) Appl. No.: 10/573,729

(22) PCT Filed: Sep. 10, 2004

(86) PCT No.: PCT/IB2004/051740

§ 371 (c)(1),
(2), (4) Date: Mar. 28, 2006

(87) PCT Pub. No.: WO2005/031909

PCT Pub. Date: Apr. 7, 2005

(65) Prior Publication Data

US 2007/0035303 A1    Feb. 15, 2007

Related U.S. Application Data

(60) Provisional application No. 60/507,640, filed on Sep. 30, 2003.

(51) Int. Cl.
*G01V 3/00*    (2006.01)
(52) U.S. Cl. ..................... 324/318; 324/322
(58) Field of Classification Search ......... 324/300–322; 600/410–435
See application file for complete search history.

(56) References Cited

U.S. PATENT DOCUMENTS

| | | | |
|---|---|---|---|
| 3,886,504 A | 5/1975 | Hartmann et al. | 333/72 |
| 4,605,009 A | 8/1986 | Pourcelot et al. | 128/660 |
| 4,620,155 A * | 10/1986 | Edelstein | 324/322 |
| 4,775,837 A * | 10/1988 | Roschmann | 324/322 |
| 4,818,938 A * | 4/1989 | Sattin et al. | 324/309 |
| 5,245,288 A | 9/1993 | Leussler | 324/322 |
| 5,248,943 A * | 9/1993 | Fox et al. | 324/322 |
| 5,691,641 A | 11/1997 | Cansell et al. | 324/309 |
| 5,908,028 A * | 6/1999 | Wilk | 128/898 |
| 6,231,516 B1 * | 5/2001 | Keilman et al. | 600/485 |
| 6,235,993 B1 | 5/2001 | Johnston et al. | 174/117 |
| 6,319,201 B1 * | 11/2001 | Wilk | 600/437 |
| 6,585,763 B1 * | 7/2003 | Keilman et al. | 623/1.42 |
| 6,735,461 B2 * | 5/2004 | Vitek et al. | 600/411 |
| 6,993,373 B2 | 1/2006 | Vrijheid et al. | 600/411 |
| 7,180,291 B2 * | 2/2007 | Chmielewski et al. | 324/318 |
| 2002/0193681 A1 * | 12/2002 | Vitek et al. | 600/411 |
| 2005/0218897 A1 | 10/2005 | Schulz et al. | 324/322 |
| 2005/0261569 A1 | 11/2005 | Schulz et al. | 600/411 |

FOREIGN PATENT DOCUMENTS

WO    WO 2004/090914 A1    10/2004

* cited by examiner

*Primary Examiner*—Brij B. Shrivastav
*Assistant Examiner*—Dixomara Vargas

(57) ABSTRACT

A transmission cable for use in a magnetic resonance apparatus is provided. The transmission cable includes a plurality of cable segments (200*n*). The cable also includes a plurality of couplers each of which transforms a first signal carried by a first cable segment into an acoustic signal and from the acoustic signal into a second signal carried by a second cable segment.

15 Claims, 4 Drawing Sheets

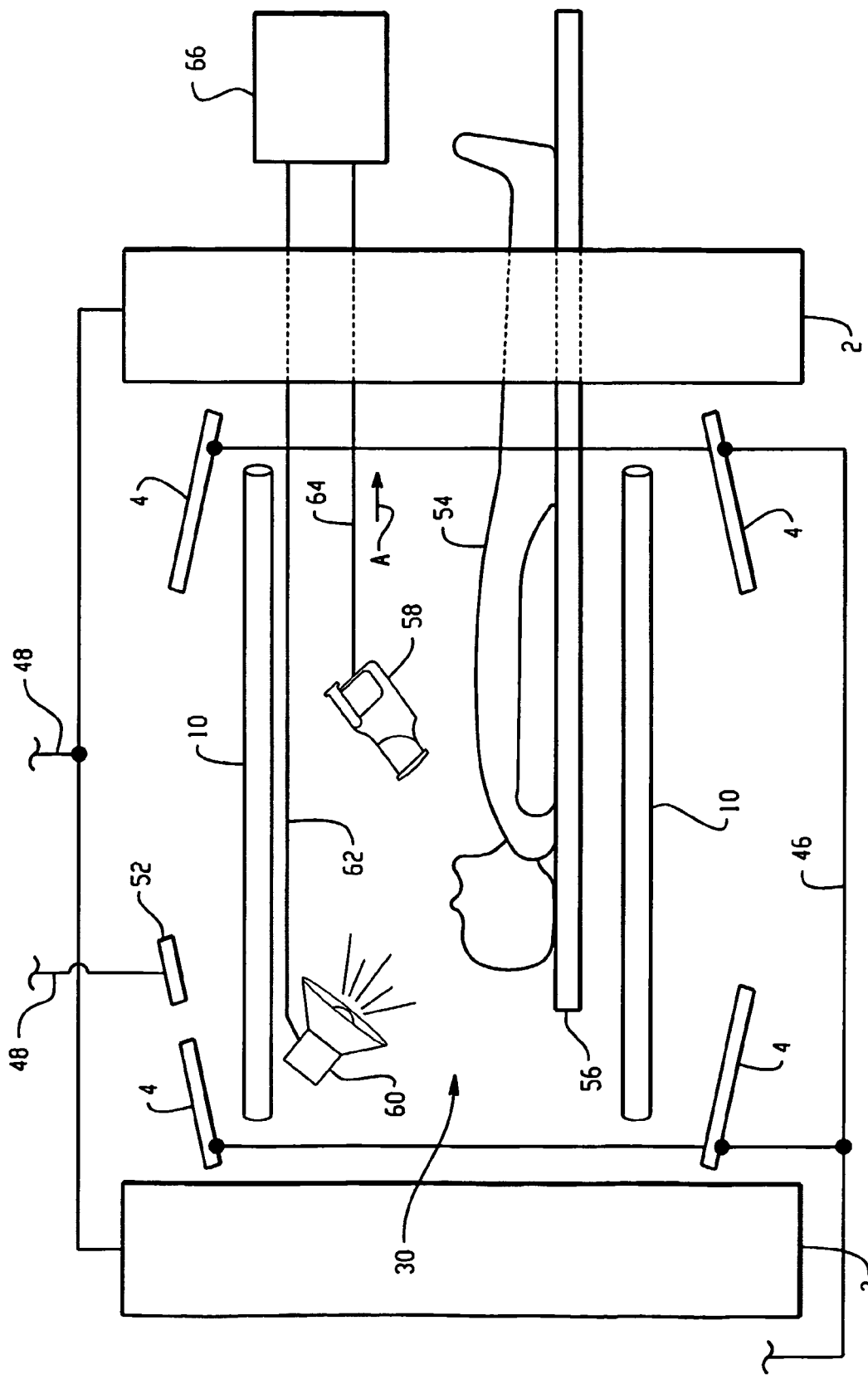

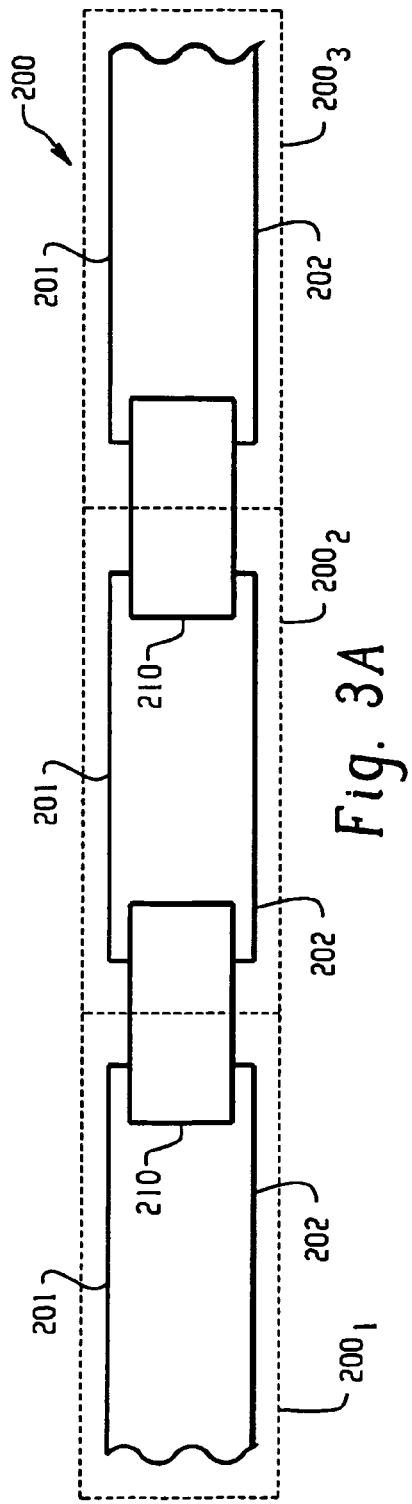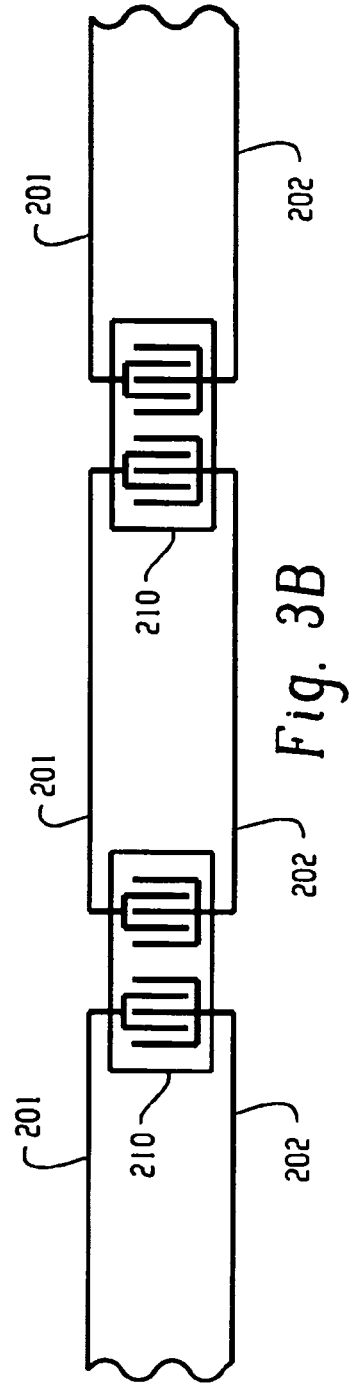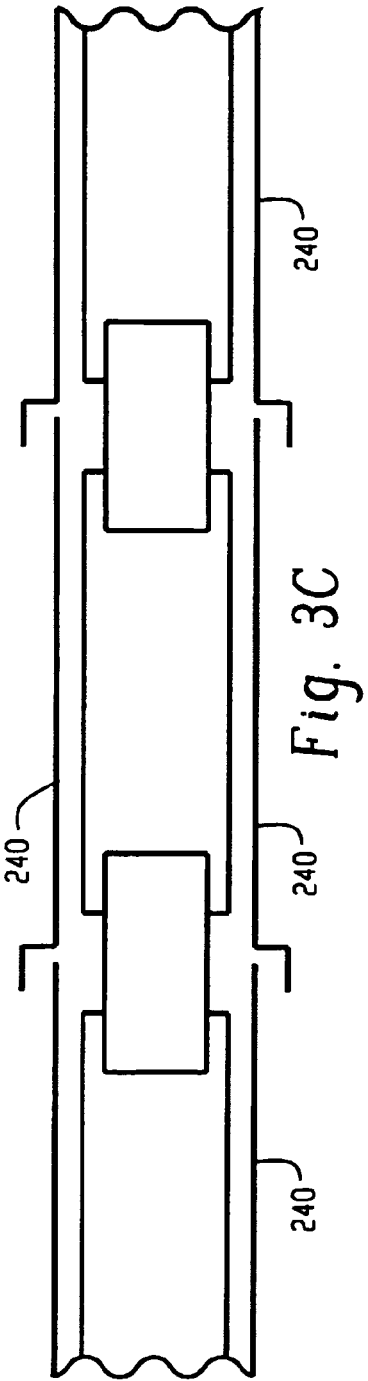

ELECTROACOUSTIC CABLE FOR MAGNETIC RESONANCE APPLICATIONS

CROSS REFERENCE TO RELATED APPLICATIONS

This application claims the benefit of U.S. provisional application Ser. No. 60/507,640 filed Sep. 30, 2003, which is incorporated herein by reference.

DESCRIPTION

The present invention relates to the field of medical imaging and has particular applicability to the field of magnetic resonance (MR) imaging. More specifically, the invention relates to a transmission cable for transmitting radio frequency signals.

The nuclear magnetic resonance (NMR) phenomenon has been utilized in the past in magnetic resonance equipment, spectroscopy instruments, and by structural chemists to analyze the structure of chemical compositions. More recently, NMR and MR systems have been developed as medical diagnostic modalities, having applications in imaging the anatomy as well as performing in vivo, non-invasive spectroscopic analyses.

The NMR/MR phenomenon can be excited within a study subject positioned in a generally homogenous, polarizing magnetic field, having a strength of, for example, 1.5T, by irradiating the object with radio-frequency (RF) energy at the Larmor frequency. In medical diagnostic applications, this is typically accomplished by positioning the patient to be examined in the field of an RF coil, having for example a cylindrical geometry and energizing the RF coil via an RF power amplifier. Upon cessation of the RF excitation, the same or a different RF coil is used to detect the NMR/MR signals emanating from subject volume lying within the field of the RF coil. In the course of a complete NMR/MR scan, pluralities of NMR/MR signals are typically observed. These signals may be used to reconstruct an image or spectroscopic information about the subject studied.

For medical imaging studies, pulsed generally linear magnetic field gradients may be used to localize the signals to desired areas within the patient to encode spatial information into the signals. In the course of an NMR/MR examination, it is frequently desired to apply pulsed magnetic field gradients in each of the X, Y and Z directions of a conventional Cartesian coordinate system.

Known fixed or optional receiver MR coils such as for example single loop coils, are typically connected to the NMR/MR scanner via standard coaxial cables. As already mentioned above, it is common to use more than one coil in the NMR/MR system. One problem that may arise in MRI is that due to the use of the standard coaxial cables, the possibility of unwanted heat generation exists and increases with the amount of coils/cables being used. Unfortunately, a prediction of parasitic resonances causing the RF heating is usually not possible because of the arrangement of arbitrarily located optional coils, which themselves may have different configurations. Also, different coils may be used for different patients.

Conventionally, bazooka balloons (common mode λ/4-resonators) are used to suppress such local resonances. However, since such bazooka balloons are resonators themselves, they are excitable and may cause that RF power is dissipated during the transmit pulse.

Transformers and capacitors have also been used to suppress such local resonances. However, these cables can results in signal loss, can require additional components such as mixers, and can be undesirably large.

Those skilled in the art will, upon reading and understanding the appended description, appreciate that aspects of the present invention address the above and other matters.

In accordance with one embodiment of the invention, a transmission cable, for use in a magnetic resonance apparatus is provided. The transmission cable includes a plurality of cable segments, and a plurality of electroacoustic couplers for providing electrical connection between segments.

In accordance with another embodiment of the invention, an MR apparatus is provided. The MR apparatus includes a first magnet system for generating a main magnetic field in an examination region, an RF coil disposed in the examination region for transmitting and/or receiving RF signals to and/or from the examination region, and a plurality of transmission cables for carrying signals with the MR system, at least one of the transmission cables comprising a plurality of cable segments and a plurality of electroacoustic couplers for coupling adjacent cable segments.

In accordance with another embodiment of the invention, a transmission cable for use in a magnetic resonance apparatus is provided. The transmission cable includes a plurality of cable segments, and a plurality of couplers each of which transforms a first signal carried by a first cable segment into an acoustic signal and from the acoustic signal to a second signal carried by a second cable segment.

In accordance with another aspect of the invention, an MR compatible catheter apparatus is provided. The MR compatible catheter includes a catheter, a preamplifier, and a transmission cable disposed between the catheter and the preamplifier, the transmission cable comprising a plurality of segments and a plurality of electroacoustic couplers for coupling signals between adjacent cable segments.

Due to the above arrangement, an embodiment is provided which reduces heat which can be otherwise generated in the cable. Also, an embodiment allows for a very slim arrangement of a transmission cable, such that the cable may have the same dimensions as for example a conventional coaxial cable. Furthermore, the transmission cable may be used for AC power transmission.

One advantage of an embodiment of the invention is that it facilitates a reduction in parasitic resonances in transmission cables.

Another advantage of an embodiment of the invention is that coupling between cable segments is facilitated.

Another advantage of an embodiment of the invention is that a reduction in size of a transmission cable is facilitated.

Another advantage of an embodiment of the invention is that construction of a segmented transmission cable is simplified.

Another advantage of an embodiment of the invention is that it is usable within a variety of field strengths.

Another advantage of the invention is that it facilitates handling of RF transmission cables in an MR apparatus.

Another advantage of an embodiment of the invention is that it facilitates transmission of the signal without adding much noise or distortion.

Still further advantages of the present invention will become apparent to those of ordinary skill in the art upon a reading and understanding of the following description of the preferred embodiments.

The invention may take form in various components and arrangements of components, and in various steps and arrangements of steps. The drawings are only for purposes of illustrating a preferred embodiment and are not to be construed as limiting the invention.

FIG. 2 shows a representation of a measuring volume of the magnetic resonance imaging apparatus shown in FIG. 1.

FIG. 3A is a diagrammatic representations of a transmission cable.

FIG. 3B is a diagrammatic representations of a transmission cable.

FIG. 3C is a diagrammatic representations of a transmission cable.

Figure 1:
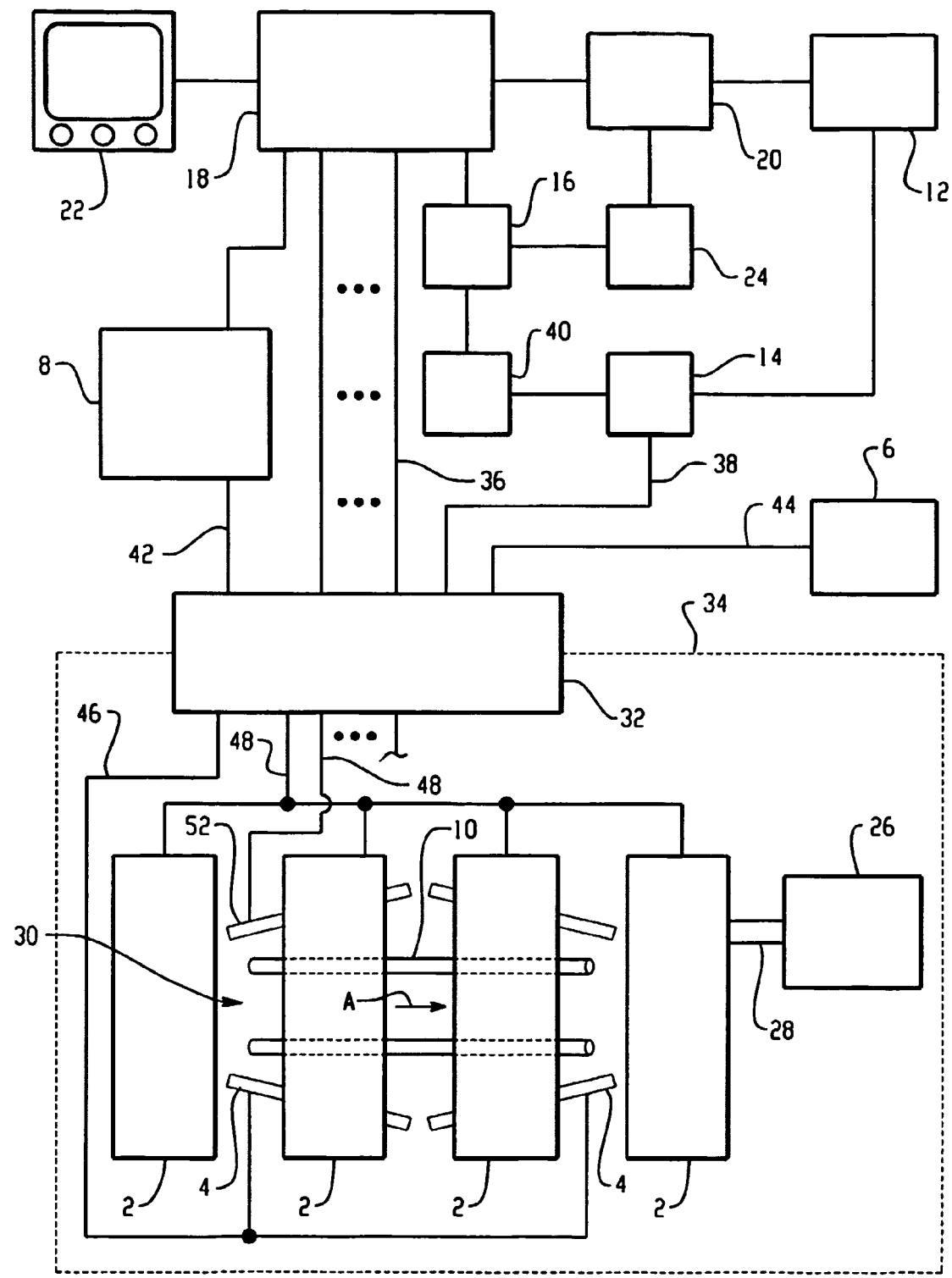
FIG. 1 shows a diagrammatic representation of a general construction of a magnetic resonance imaging apparatus.

FIG. 1 shows a diagrammatic representation of an embodiment of a general construction of a magnetic resonance imaging apparatus according to the present invention. The magnetic resonance imaging apparatus depicted in FIG. 1 includes a first magnet system 2. The first magnet system 2 is adapted to generate a uniform, study magnetic field A as indicated with the arrow in FIG. 1. Reference character 4 depicts a second magnet system, which generates magnetic gradient fields. Reference character 6 designates a first power supply source for the first magnet system 2 and reference character 8 designates a second power supply source for the second magnet system 4.

An RF coil 10 is provided to generate a RF magnetic alternating field. The RF coil 10 is connected to a RF transmission device, which includes a RF source 12. The RF coil 10 may furthermore be adapted to be used for the detection of spin resonance signals generated by the RF transmission field in an object to be examined (not shown). For the detection of spin resonance signals generated by the RF transmission field, the RF coil 10 is connected to an RF receiving device, which includes a signal amplifier 40. The output of the signal amplifier 40 is provided to a detector 16.

The detector 16 is connected to a control unit 18. The control unit 18 such as a computer is adapted to control a modulator 20 for operation with the RF source 12.

Furthermore, the control unit 18 is adapted to control the first power supply source 8 and a display 22, such as a CRT display for displaying an image reconstructed by the control unit 18.

Furthermore, there is provided a RF oscillator 24 for controlling the modulator 20 and the detector 16, which processes the measuring signals. The forward and return RF signal traffic are separated from each other by a separation circuit 14.

Reference character 26 designates a cooling device arranged to cool the magnet coils of the first magnet system 2 via cooling duct 28. The RF coil 10, which is spatially arranged within the first and second magnet systems 2 and 4 encloses an examination 10 volume 30. In the case of medical MR applications, the examination volume 30 should be large enough to enclose a patient to be examined or at least a part of the patient to be examined, such as the neck or an arm.

By the above arrangement, a steady magnetic field A, gradient fields, which select object slices and a spatially uniform RF alternating field can be generated in the examination volume 30. As already mentioned above, the RF coil 10 may be adapted to be capable of combining the functions of transmitter coils and measuring coils. However, it is also possible to use different coils for these two functions. For example, surface coils may act as measuring coils. The assembly formed by the first magnet system 2, the RF coil 10 and the second magnet system 4 (gradient coils) may be enclosed by an RF shielding Faraday cage 34.

In addition to that, an optional receive MR coil 52 can be provided, which, for example may be a surface coil.

Reference character 32 designates a feed-through device, connected to the second power supply source 8 by means of a first supply line 42, connected to the separation circuit 14 by means of a RF connection line 38, connected to the first power supply source 6 by means of a second power supply line 42 and connected to the control unit 18 by means of connection leads 36, which are preferably realized as a bundle of cables.

Within the Faraday cage, i.e. within an environment where strong magnetic fields occur, the feed-through device 32 is connected to the second magnet system 4 by means of a first supply cable 46, to the first magnet system by means of a second supply cable 48, which is preferably a bundle of cables, including one cable 48 which is connected to the MR coil 52.

In one embodiment, the cable 48 between the feed-through device 32 and the MR coil 52 is realized with a cable as shown in FIGS. 3A-3C. However, it may also be possible to use such a transmission line in all electrical connections provided within the Faraday cage 34 or within an environment including strong magnetic fields. In other words, each of the first supply cables 46, the second supply cables 48 and each of the connection cables may be realized by one or more cables as shown in FIGS. 3A-3C. Furthermore, it is also possible to use such cables for the connection leads 36, the RF connection line 38, the first supply line 42 or the second supply line 40.

FIG. 2 is a more detailed representation of the examination volume 30 of the MRI apparatus shown in FIG. 1. In FIG. 2, there is a patient 54 arranged on a patient table 56 within the examination volume 30. In the embodiment shown, the patient 54 is arranged such that slice images can be formed of the head and of the neck. Within or in the direct vicinity of the examination volume 30 there is provided electrical connection equipment for maintaining a communication with the patient 54 to be examined. In the embodiment depicted in FIG. 2, there is provided a camera 58 and a lamp 60. However, other electrical devices necessary or useful for examining the patient 54 may be provided. The camera 58 and the lamp 60 are connected by means of third and fourth supply cables 62 and 64 to a power supply 66. The third and fourth supply cables 62 and 64 may also be used for signal transmission, for example for transmitting an image signal from the camera 48 to the display 22. As already mentioned above, other electrical equipment may be arranged within or near the examination volume 30, for example sensors for measuring the blood pressure of the patient 54, a heart beat or a cerebral activity of the patient 54. Also, there may be provided communication equipment for communication with the patient 54.

The third and fourth supply cables 62 and 64 may be realized in accordance with cables such as that depicted in FIG. 3.

FIGS. 3A-3C show a transmission cable 200 for transmitting a signal or energy. As shown in FIGS. 3A-3C the transmission cable includes a number of segments $200_1$-$200_3$. It is to be understood, that the cable can include more or less than three segments as desired. In one embodiment, the cable segments have lengths of approximately $\lambda/4$. However, the length of the individual cable segments may be selected differently as long as the length is not $\lambda/2$ or some integer multiple thereof. For example, in a 1 T system, a cable having an overall length of seven meters might include four segments.

As shown in FIG. 3A, each cable segment includes a first conductor 201 and a second conductor 202. The transmission cable also includes electroacoustic couplers 210 disposed between each segment for providing electrical connections therebetween.

Figure 4:
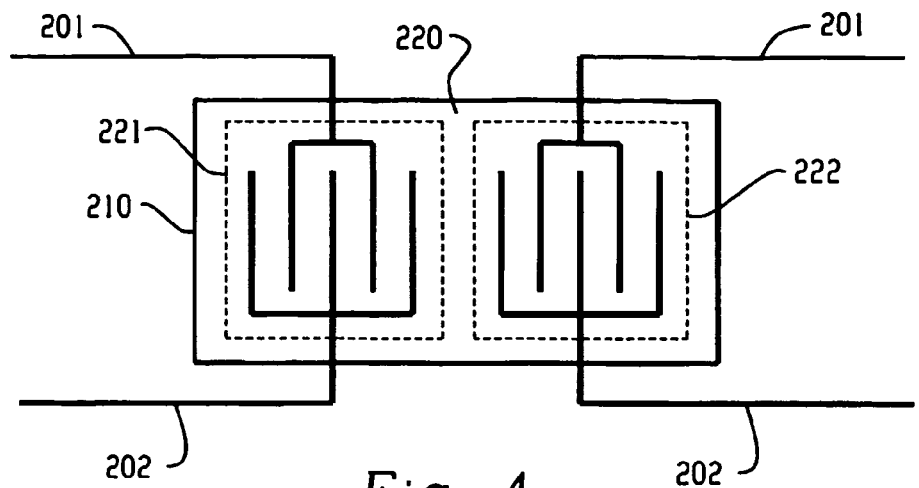
FIG. 4 is an illustration of an electroacoustic coupler.

As shown in FIG. 3B and with particular attention to FIG. 4, the electroacoustic couplers 210 include a substrate 220, a first set of conductive fingers 221, and a second set of conductive fingers 222. In one embodiment, the electroacoustic couplers are surface acoustic wave devices. For such an embodiment, the substrate 220 can be a piezoelectric substrate such as quartz, lithium-niobate, or PZT and the finger structures are conductors deposited on the substrate. In the embodiment shown, the finger structures have leads that extend to the first and second conductors 201, 202 of the cable segments.

As can be seen, there is no direct path by which the common mode can travel between cable segments. It should also be noted that the coupling capacitance between the fingers can be much lower than 5 pF, so the common mode can be sufficiently suppressed.

In operation the segments are coupled via the electroacoustic couplers. Regardless of the source from within the MR system, or from which elements of the system the cable is connecting, as a voltage is applied to the conductors 201, 202 of the cable (for example at the left end of the cable as shown in FIGS. 3A-3C), a voltage differential is realized therebetween. Such voltage differential causes bending in the fingers of the first set of conductive fingers 221, and mechanical waves are induced in the substrate. Coupling between segments occurs as the mechanical waves, induced by the first set of fingers 221, are received by the second set of conductive fingers 222. The mechanical waves received by the second set of conductive fingers induce a voltage differential therebetween and the signal is passed along successive segments accordingly.

As shown in FIG. 3C, in one embodiment, the transmission cable optionally includes a shield 240. Here, the shield segments are not connected between segments so that standing wave conditions along the cable are reduced.

Figure 5:
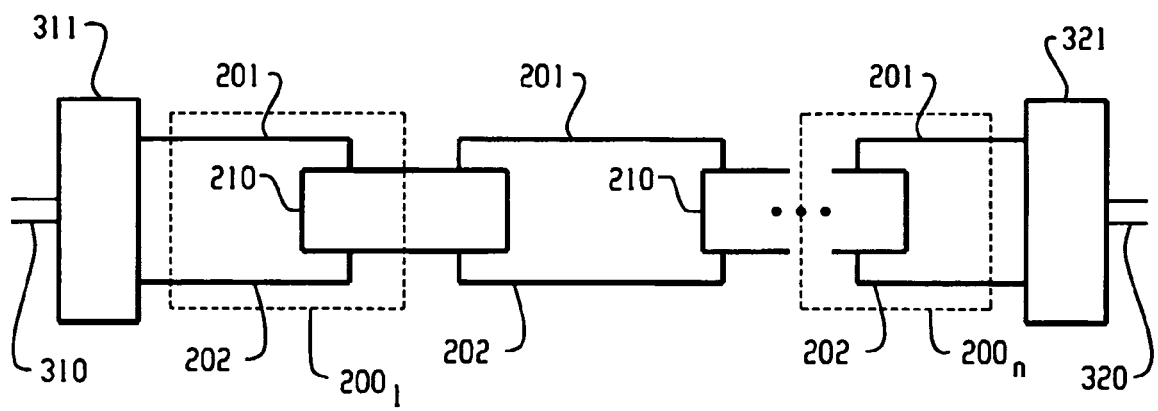
FIG. 5 is an illustration of a transmission cable having mixers disposed at the ends of the cable.

As shown FIG. 5, in one embodiment, at one end of the first cable segment $200_1$ there is provided a first mixer 311. The first mixer can be connected to a standard RF port 310. At the other end of the cable, i.e. at the terminal end of the last segment $200_n$ there is provided a second mixer 321. The second mixer can be connected to a coil via a coil port 320. Here, the mixers can shift the signal frequency to the resonance frequency of the electroacoustic coupler and/or transmit more than one signal over the cable by using different frequencies and different resonances of the coupler.

As depicted in FIG. 5, for MR signal and/or power transmission, the mixers 311 and 321 optionally may be provided for shifting a signal to be transmitted via the cable to a higher frequency. Due to this, the whole two-port system, i.e. from the standard RF port 310 to the coil port 320, acts as a simple but safe cable and allows for an interchangeability of the cable.

Along with the above described embodiments, it is contemplated that more than one coupler are applied in parallel between cable segments to separate power signals from measured signal. Alternatively separate cables with adapted couplers to transmit the power can be implemented.

Figure 6:
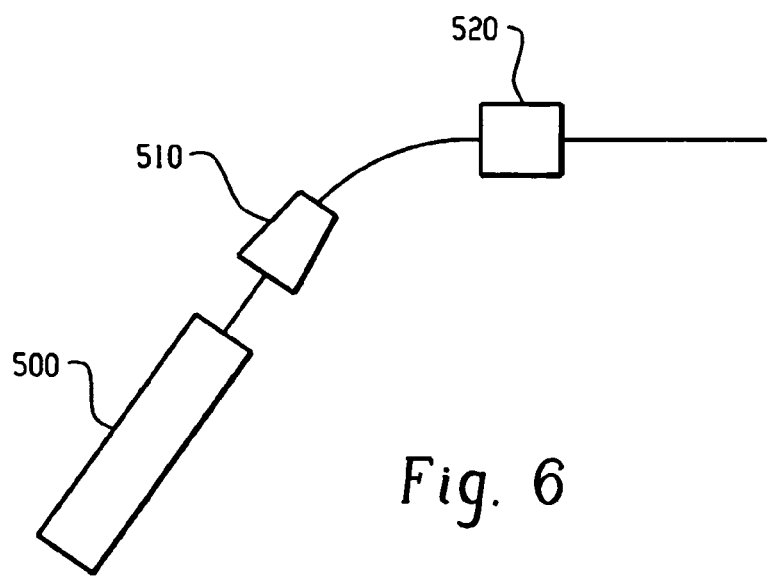
FIG. 6 is an illustration of a catheter having an electroacoustic coupler.

Apart from being used in MR/NMR applications, the transmission cable according to the present invention may also be used in other environments with strong magnetic fields such as, for example, adjacent to electric machines. Also, the cable according to the present invention may be used for a MR-catheter 500 as shown in FIG. 6.

Here, an electoacoustic coupler 510 is disposed at the proximal end of the catheter between the leads coming out of the catheter 500 and a preamplifier 520. Couplers may also be disposed within the catheter as desired.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

What is claimed is:

1. A transmission cable for use in a magnetic resonance apparatus which induces resonance at a magnetic resonance frequency, the transmission cable comprising:
   a first cable segment;
   a second cable segment;
   a third cable segment;
   a first electroacoustic coupler which couples the first and second cable segments at a selectable signal frequency and which blocks common mode currents;
   a second electroacoustic coupler which couples the second and third cable segments at the selectable signal frequency and which blocks common mode currents; and
   a first mixer disposed at a first end of the cable for shifting the selectable signal frequency associated with the electroacoustic couplers to enable the transmission of signals at difference frequencies other than the magnetic resonance frequency and inhibit unwanted cable heating.

2. The transmission cable as set forth in claim 1 further comprising:
   a second mixer disposed at a second end of the cable for shifting the selectable signal frequency associated with the electroacoustic couplers.

3. The transmission cable as set forth in claim 1, wherein none of the cable segments has a length which is a multiple of λ/2 where λ is a wavelength at the magnetic resonance frequency.

4. The transmission cable as set forth in claim 3, wherein the cable segments are quarter λ segments.

5. A transmission cable for use in a magnetic resonance apparatus, the transmission cable comprising:
   a plurality of cable segments including a first cable segment, a second cable segment, and a third cable segment, each of the plurality of segments having a length which is not a multiple of λ/2 where λ is a wavelength of a magnetic resonance frequency of the magnetic resonance apparatus;
   a plurality of electroacoustic couplers for providing an RF signal connection between segments, including a first electroacoustic coupler coupling the first and second segments and a second electroacoustic coupler coupling the second and third segments;
   wherein each cable segment comprises a first conductor and a second conductor and each of the first and second conductors is connected to at least one electroacoustic coupler.

6. A transmission cable for use in a magnetic resonance apparatus, the transmission cable comprising:
   at least three cable segments; and
   a plurality of electroacoustic couplers which provide electrical connection between adjacent cable segments, each electroacoustic coupler including:
   a substrate;
   a first set of conductive fingers disposed on the substrate; and a second set of conductive fingers disposed on the substrate whereby an acoustic signal is passed from the first set of conductive fingers to the second set of conductive fingers.

7. An MR compatible catheter apparatus comprising:
a catheter;
a preamplifier; and
a transmission cable as set forth in claim 6 disposed between the catheter and the preamplifier.

8. A MR apparatus comprising:
a first magnet system for generating a main magnetic field in an examination region;
an RF coil disposed in the examination region for transmitting and/or receiving RF signals to and/or from the examination region; and
a plurality of transmission cables for carrying signals with the MR system, at least one of the transmission cables comprising a plurality of at least three cable segments and a plurality of electroacoustic couplers for coupling adjacent cable segments, each cable segment including a first conductor and a second conductor and each of the first and second conductors being connected to at least one of the electroacoustic couplers.

9. The MR apparatus as set forth in claim 8, wherein the at least one transmission cable further comprises a first mixer disposed at a first end of the cable for shifting a signal frequency associated with the electroacoustic couplers.

10. The MR apparatus as set forth in claim 9 wherein the at least one transmission cable further comprises a second mixer disposed at a second end of the cable for shifting a signal frequency associated with the electroacoustic couplers.

11. The MR apparatus as set forth in claim 8, wherein each electroacoustic coupler comprises:
a substrate;
a first set of conductive fingers disposed on the substrate; and
a second set of conductive fingers disposed on the substrate whereby an acoustic signal is passed from the first set of conductive fingers to the second set of conductive fingers.

12. The MR apparatus as set forth in claim 8, wherein the cable segments are a quarter of a wavelength of the RF signals.

13. A transmission cable for use in a magnetic resonance apparatus the transmission cable comprising:
at least first, second, and third cable segments;
a first coupler which transforms a first signal carried by a first cable segment into a first acoustic signal and from the first acoustic signal into a second signal carried by a second cable segment; and
a second coupler which transforms the second signal carried by the second cable segment into a second acoustic signal and from the second acoustic signal into a third signal carried by the third cable segment;
wherein each coupler has a high impedance for a common mode wave on the cable.

14. The transmission cable as set forth in claim 13, wherein the cable has a first end and a second end, wherein a mixer is disposed at each of the first and second ends for shifting a frequency of a signal transmitted by the cable.

15. An MR compatible catheter apparatus comprising:
a catheter;
a preamplifier; and
a transmission cable as set forth in claim 13 disposed between the catheter and the preamplifier.

* * * * *